(12) United States Patent
Jeong et al.

(10) Patent No.: US 6,350,649 B1
(45) Date of Patent: Feb. 26, 2002

(54) BIT LINE LANDING PAD AND BORDERLESS CONTACT ON BIT LINE STUD WITH ETCH STOP LAYER AND MANUFACTURING METHOD THEREOF

(75) Inventors: Hong-Sik Jeong, Suwon; Won-Suk Yang, Yongin; Ki-Nam Kim, Anyang, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/699,849

(22) Filed: Oct. 30, 2000

(51) Int. Cl.[7] .......................................... H01L 21/8242
(52) U.S. Cl. ..................................... 438/256; 438/253
(58) Field of Search ........................... 438/238, 253, 438/256, 314, 381, 393, 693, 703, 234, 396, 399

(56) References Cited

U.S. PATENT DOCUMENTS

| | | | |
|---|---|---|---|
| 4,966,870 A | 10/1990 | Barber et al. | 437/228 |
| 5,466,636 A | 11/1995 | Cronin et al. | 437/187 |
| 5,612,254 A | 3/1997 | Mu et al. | 437/195 |
| 5,808,335 A | 9/1998 | Sung | 257/306 |
| 5,891,799 A | 4/1999 | Tsui | 438/624 |
| 5,895,239 A | 4/1999 | Jeng et al. | 438/239 |
| 5,918,120 A | 6/1999 | Huang | 438/239 |
| 6,008,083 A | * 12/1999 | Brabazon et al. | 438/239 |
| 6,022,776 A | 2/2000 | Lion et al. | 438/253 |
| 6,037,215 A | * 3/2000 | Lee et al. | 438/253 |
| 6,083,824 A | 7/2000 | Tsai et al. | 438/629 |
| 6,156,643 A | * 12/2000 | Chan et al. | 438/638 |

OTHER PUBLICATIONS

"Impact of passivation film deposition and post–annealing on the reliability of flash memories," Shuto et al., 1997 ICEE International Reliability Physics Symposium Proceedings (35th Annual), pp. 17–24.

* cited by examiner

Primary Examiner—David Nelms
Assistant Examiner—Phuc T. Dang
(74) Attorney, Agent, or Firm—Mills & Onello LLP

(57) ABSTRACT

An etch-stop layer is selectively provided between layers of a multiple-layered circuit so as to allow for outgassing of impurities during subsequent fabrication processes. The etch-stop layer is formed over an underlying stud so as to serve as an alignment target during formation of an overlying stud formed in an upper layer to be coupled to the underlying stud. In this manner multiple-layered circuits, for example memory devices, can be fabricated in relatively dense configurations.

21 Claims, 4 Drawing Sheets

BIT LINE LANDING PAD AND BORDERLESS CONTACT ON BIT LINE STUD WITH ETCH STOP LAYER AND MANUFACTURING METHOD THEREOF

RELATED APPLICATIONS

The present application is related to U.S. Ser. No. 09/699,591, entitled "Bit Line Landing Pad and Borderless Contact on Bit Line Stud with Localized Etch Stop Layer and Manufacturing Method Thereof", filed of even date herewith; and U.S. Ser. No. 09/699,589, entitled "Bit Line Landing Pad and Borderless Contact on Bit Line Stud with Localized Etch Stop Layer Formed in Void Region, and Manufacturing Method Thereof", filed of even date herewith, and incorporated herein by reference.

BACKGROUND OF THE INVENTION

In order to make more efficient use of integrated circuit surface area, conventional two-dimensional semiconductor technology has evolved such that contemporary circuits are formed on multiple layers in a three-dimensional configuration. In such configurations, active devices and interconnects are formed in a layered relationship. During the formation of each subsequent layer, an inter-layer pathway, referred to in the art as a "plug", or "stud" is electrically coupled between the various active devices and transmission lines of the different layers. To assist in aligning a plug, "landing pads" or "taps" are formed in lower layers to serve as a target for the plugs passing from the upper layer. The landing pads are coupled to an underlying circuit or interconnect and are generally larger in surface area than the circuit or interconnect to serve as a wider-tolerance target for the plug.

Such multi-layered technology has enabled the design of highly-integrated memory devices, for example DRAM devices, having extremely high capacity, for example above 1 gigabyte. Such DRAM devices include multiple arrays of memory cells, densely and efficiently laid out under tight design constraints. Between the cell areas are peripheral regions, which include supporting circuitry and interconnect circuitry between the cells, as well as input/peripherals, and the like.

Any misalignment between the vertical plugs and the horizontal interconnect features can cause defects and reliability problems. To ensure that the plug aligns with a feature, the features are made larger than required, for example through the use of landing pads. The area by which the feature is made larger is referred to in the art as a "border" around the vertical contact hole. Any excessive border area thus has a negative impact on circuit density.

Attempts have been made in the past to provide multiple layer interconnect, while reducing or eliminating the border area. These include circuits and fabrication procedures disclosed in U.S. Pat. Nos. 6,083,824, 5,612,254, and 4,966,870.

To a larger extent, the packing density of circuits is limited by how closely the interconnect metal between circuits can be formed without encroaching on each other. These limits are dictated by design rules that govern the separation of one level of contact from another, and by design rules for nesting tolerance or for borders used around contacts.

Other efforts have made toward reducing the high-aspect ratio of the holes made for inter-level interconnects, where the aspect ratio refers the height of a hole as compared to its width. In general, the deeper the hole, the more difficult it is to fabricate the hole. Using the line of an underlying circuit, for example a bit line of a DRAM memory device, as a landing pad, the aspect ratio of the interconnection hole can be significantly reduced.

Figure 1:
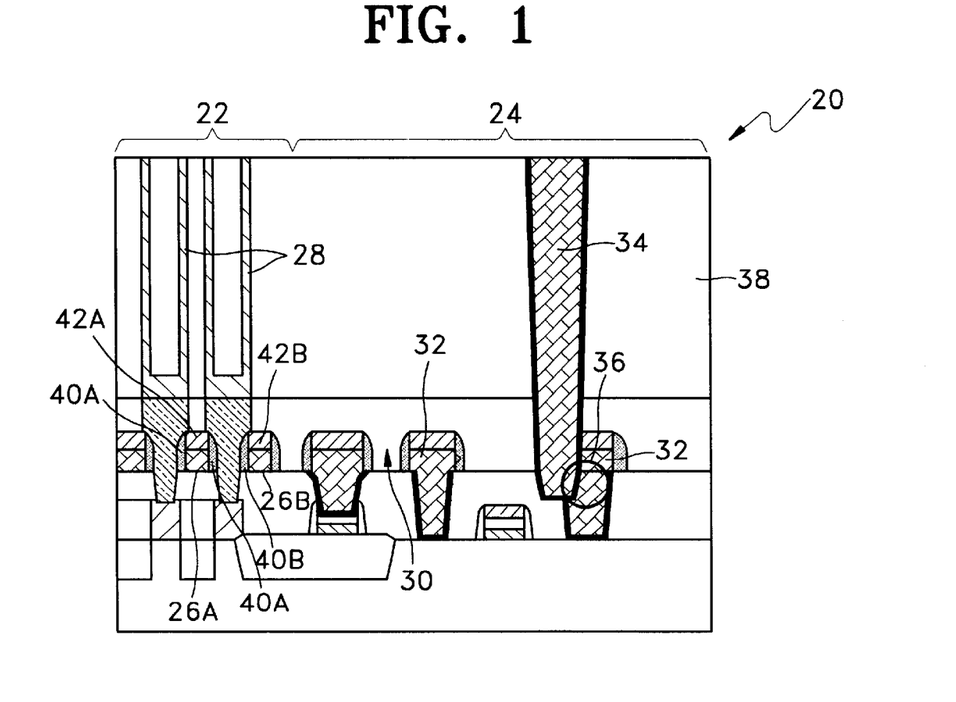
FIG. 1 is a cutaway side view of a conventional memory device including cell and peripheral regions.

A typical multiple-layer DRAM memory device 20 is illustrated in FIG. 1. The memory device includes a cell region 22 and a peripheral region 24. The cell region 22 includes active switching devices, coupled to vertically-oriented capacitors 28, that serve as data storage devices. A cell bit line 26 serves as an interconnect to transfer data between peripheral circuit regions and the cell region 22. The peripheral region 24 includes a number of bit lines 32, that function as local interconnects, or studs, electrically coupling between the various active devices and transmission lines of the different layers. An insulative oxide layer 38 is formed above the bit lines 32, and an interconnect stud 34 is opened through the oxide layer and connected to the bit line 32.

When the bit lines 32 are used for local interconnection, for example especially in sense amplifier regions, the layers of circuits can become very dense and crowded. For example, to access the bit line 32 from an upper layer, the region 30 between the bit lines must be accurately etched to form a stud interconnect hole; both in a lateral direction, so as to avoid contact with adjacent bit lines, and in a vertical direction, so as to ensure that the hole is formed at the proper depth. Because the peripheral region 24, for example a sense amplifier region of a DRAM device, is often times densely populated with various interconnect paths, the cross-sectional area of any vertical stud interconnects should be minimized. Therefore, the above case requires subsequent formation of high-aspect-ratio studs that are difficult to achieve using contemporary fabrication processes.

Contemporary techniques of forming the interconnect stud are subject to several process limitations. These include horizontal misalignment, in a lateral direction, where the stud hole may be laterally misaligned with the underlying bit line during formation of the stud hole. Vertical misalignment can also occur, wherein the stud hole is not etched deep enough, so the stud does not make contact with the underlying bit line, or wherein the stud hole is etched too deeply, and is etched through the bit line, as shown in region 36 of FIG. 1.

To improve alignment accuracy, U.S. Pat. No. 5,895,239 discloses a technique for employing a bit line landing pad together with a bit line stud. However, this approach requires tight tolerances at either, or both, the top portions of the bit lines, including the landing pad, and bottom portions of the upper interconnect stud, so as to provide a minimal width at the top of the bit line, and a maximum width at the bottom of the upper interconnect stud. A wide stud top limits circuit density considerations, while a narrow stud bottom leads to increased contact resistance and an increased aspect ratio that is difficult to accurately fabricate. No provision is made for vertical alignment of the stud, so if the stud hole is slightly misaligned with the underlying bit line, a void can be formed in the underlying inter-layer dielectric adjacent the stud.

Another approach at multiple-layered interconnect is disclosed in U.S. Pat. No. 5,891,799. In this approach, an etch-stop layer, for example a silicon nitride masking layer ($Si_3N_4$) is formed over an inter-layer dielectric ($SiO_2$). Stud holes are patterned in the mask layer and underlying dielectric layer for the deposit of studs to connect to the lower layer. Once the studs are formed, the masking layer later serves as an etching reference for eventual formation of landing pads for studs formed through an upper layer. However, this technique suffers from a number of limitations. Since the $Si_3N_4$ masking layer is a high-stress-bearing material, and is formed indiscriminately as a layer over the entire circuit, this configuration imparts undue stress on the various layers, which may lead to warping of the circuit. Additionally, due to its high density, the masking layer prevents outgassing of impurities contained in the inter-layer dielectric, for example C, F, and Cl, during later high-temperature processes. The remaining $Si_3N_4$ masking layer would prevent the introduction of $H_2$ and $O_2$ during popular alloy processes, greatly affecting the conductive adhesiveness between the upper and lower metals and defect curing efficiency.

Furthermore, this process is incompatible with contemporary memory fabrication processes, because the $Si_3N_4$ masking layer would be applied between bit lines. With reference again to FIG. 1, dielectric spacers 40A, 40B are formed on each lateral side of cell bit line 26A prevent shorting between the cell bit line 26A and the capacitor 28. In order to make such spacers 40A, it would be necessary to remove any masking layer between adjacent bit lines 26A, 26B to allow for space for the capacitors 28 to be inserted between the bit lines 26A, 26B. However, this process would also remove any dielectric layer 42A, 42B formed over the bit lines 26A, 26B necessary for insulating the bit lines 26A, 26B from the capacitors. This would also remove any masking layer on either side of the peripheral region bit lines 32, defeating the purpose of forming the masking layer in the first place.

SUMMARY OF THE INVENTION

The present invention is directed to a fabrication process and circuit that addresses the limitations of conventional techniques. For example, the present invention provides an etch-stop layer that is selectively patterned on only a portion of the underlying inter-layer dielectric, thereby allowing for outgassing during later fabrication processes. Additionally, the etch stop layer may be formed over an underlying stud so as to serve as an alignment target during formation of an overlying stud formed in an upper layer.

In one aspect, the present invention is directed to a semiconductor device comprising a first insulating layer and a first stud formed in the first insulating layer. An etch stop material layer is formed over the first stud and a second insulating layer is formed over the etch stop material layer. A second connectivity stud is formed through the second insulating layer and through the etch stop material layer, the first and second studs being in electrical contact with each other.

In a preferred embodiment, the etch stop material layer and second insulating layer have different etching selectivities. The second connectivity stud may formed by first etching the second insulating layer to the etch stop layer, followed by etching the etch stop material layer to expose the first stud. The etch stop material layer preferably may comprise silicon nitride. An etch-blocking layer may be provided above the first stud and below the etch-stop material layer.

In another aspect, the present invention is directed to a semiconductor device comprising first and second circuit regions laterally disposed in a first insulating layer, wherein the first circuit region comprises a conductive line, and wherein the second circuit region comprises a stud. An etch stop material layer is formed over the conductive line and the stud, the etch stop layer being selectively patterned in the first circuit region to form lateral spacers on lateral faces of the conductive line, the etch stop layer coating the second circuit region. A second insulating layer is formed over the etch stop layer, and a contact hole is provided through the second insulating layer, and through the etch stop layer to expose an upper portion of the stud. Contact metal is provided in the contact hole, electrically contacting the stud.

The first circuit region preferably comprises a cell region and the second circuit region preferably comprises a peripheral region of a memory device. The conductive line may comprise a bit line of the memory device.

The etch stop material layer may comprise silicon nitride. The etch stop material layer and second insulating layer may have different etching selectivities. The contact hole may be formed by first etching the second insulating layer to the etch stop material layer, followed by etching the etch stop material layer to expose the stud. The etch stop material layer may forms lateral spacers for the conductive lines in the first circuit region. An etch-blocking layer may be formed above the stud and below the etch-stop material layer.

In another aspect the present invention is directed to a semiconductor device comprising a circuit formed in a semiconductor substrate, the circuit having first and second terminals. A first insulating layer is formed above the circuit and a stud hole is formed in the first insulating layer above the first terminal. An electrically conductive stud is formed in the stud hole, electrically contacting the first terminal. A conductive line is formed on the first insulating layer above the second terminal, the conductive line electrically contacting the second terminal. An etch stop material layer is formed over the first insulating layer, stud, and conductive line, the etch stop material layer providing insulative spacers on lateral portions of the conductive line. A second insulating layer is formed over the etch stop material layer, and contact hole is formed through the second insulating layer, and through the etch stop layer to an upper portion of the stud. Contact metal is formed in the contact hole, electrically contacting the stud.

In another aspect, the present invention is directed to a semiconductor device comprising first and second circuit regions laterally disposed in a first insulating layer, wherein the first circuit region comprises a conductive line, and wherein the second circuit region comprises a stud. An etch stop material layer is formed over the conductive line and the stud, the etch stop layer being selectively patterned in the first circuit region to form lateral spacers on lateral faces of the conductive line, the etch stop layer coating the second circuit region. A second insulating layer is formed over the etch stop layer and a contact hole is provided through the second insulating layer, and through the etch stop layer, to expose an upper portion of the stud. Contact metal is provided in the contact hole, electrically contacting the stud, such that the etch stop material layer operates to form lateral insulative spacers of the conductive line and serves as an etch stop during forming of the contact hole.

In another aspect, the present invention is directed to a method for forming a semiconductor device. A first insulating layer is formed above a semiconductor circuit. A first stud hole is provided in the first insulating layer, and conductive material is deposited to form a first stud in the first stud hole. An etch stop material layer is provided over the first stud and a second insulating layer is provided over the etch stop material layer. A second stud hole is provided through the second insulating layer and through the etch stop material layer to expose a top portion the first stud. Conductive material is provided to form a second stud in the second stud hole.

In a preferred embodiment, the second stud hole is formed by first etching the second insulating layer to the etch stop material layer, followed by second etching the etch stop material layer to expose the first stud. The first etching may be performed with an oxide etchant gas, and the second etching may be performed using a nitride etchant gas.

In another aspect, the present invention is directed to a method for forming a semiconductor device. A first insulating layer is formed above a semiconductor circuit. A first circuit region comprising a conductive line is formed on the first insulating layer, and a second circuit region comprising a stud is formed through the first insulating layer. An etch stop material layer is formed over the first and second regions. Lateral spacers are formed in the first circuit region on lateral faces of the conductive line by selectively removing the etch stop material layer in the first circuit region while leaving the etch stop material layer substantially intact in the second circuit region. A second insulating layer is formed over the first and second circuit regions, and a contact hole is provided through the second insulating layer, and through the etch stop layer to expose an upper portion of the stud. Contact metal is provided in the contact hole, electrically contacting the stud.

In another aspect, the present invention is directed to a method for forming a semiconductor device. A circuit having first and second terminals is formed in a semiconductor substrate. A first insulating layer is formed above the circuit, and a stud hole is etched above the first terminal. Electrically conductive contact metal is formed in the stud hole, electrically contacting the first terminal. A conductive line is formed on the insulating layer above the second terminal, the conductive line electrically contacting the second terminal. An etch stop material layer is provided over the first insulating layer, stud, and conductive line. The etch stop material layer is selectively removed to provide insulative spacers on lateral portions of the conductive line, and to substantially retain the etch stop material layer in a region above the stud. A second insulating layer is formed over the etch stop material layer. A contact hole is provided through the second insulating layer, and through the etch stop layer to an upper portion of the stud. electrically conductive contact metal is provided in the contact hole.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Throughout the detailed description, the principles of the present invention are illustrated in the context of a memory device having cell and peripheral regions. It will be apparent to those skilled in the art that the circuits and processes of the present invention disclosed herein are equally applicable to other multiple-layered circuit embodiments.

Figure 2:
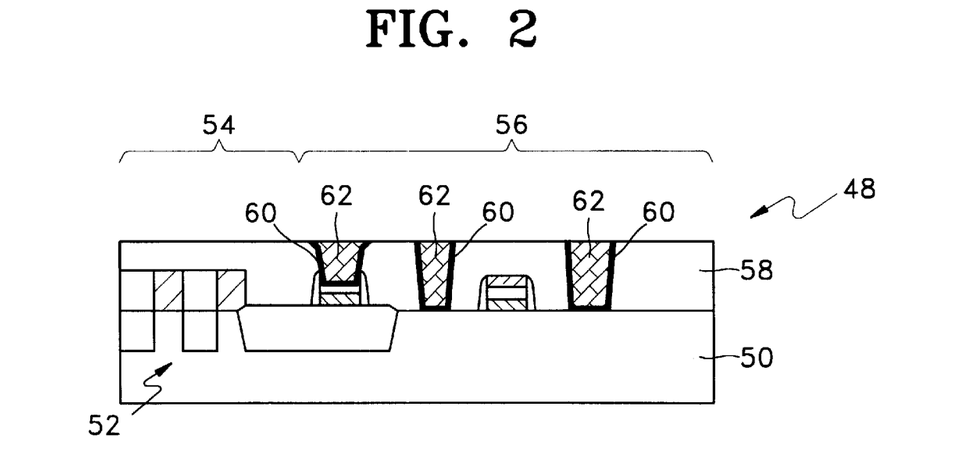
FIG. 2 is a cutaway side view of formation of contacts in a dielectric layer for a memory device including cell and peripheral regions, in accordance with the present invention.

FIG. 2 is a cutaway side view of the initial formation of contacts in a dielectric layer for a memory device including cell and peripheral regions, in accordance with the present invention. An active cell 52 is formed in a substrate 50 of a memory device 48. The memory device 48 includes a cell region 54 comprising densely-packed memory cells, data lines, and address lines, and a peripheral region 56, including interconnect lines, and peripheral circuitry, for example input/output circuitry, that services the memory cell region 54. Collectively, in the context of a memory device application, the data lines and peripheral interconnect lines are referred to herein as "bit lines". However, as explained above, the present invention is equally applicable to other circuits requiring layer-to-layer interconnect.

An inter-layer dielectric layer 58, for example $SiO_2$, is formed on the active circuits 52 and substrate 50. Holes 60 are formed in the dielectric layer, for example by etching, and bit line stud contacts 62 are provided in the holes 60. The contacts are preferably formed of tungsten, at a thickness of 500–2000 Angstroms. The gas reaction for deposition may comprise, for example:

$$WF_6+SiH_4+H_2 \rightarrow W+SiF_4+H_2$$

at 40 Torr, and 415 C. Typical n+/p+ contact resistance values are in the range of 300–1000 ohms per contact, assuming a 0.15 µm—wide bit line to an n+ contact, and 1.5–5 kilohms per contact for a 0.23 µm bit line to a p+ contact.

Figure 3:
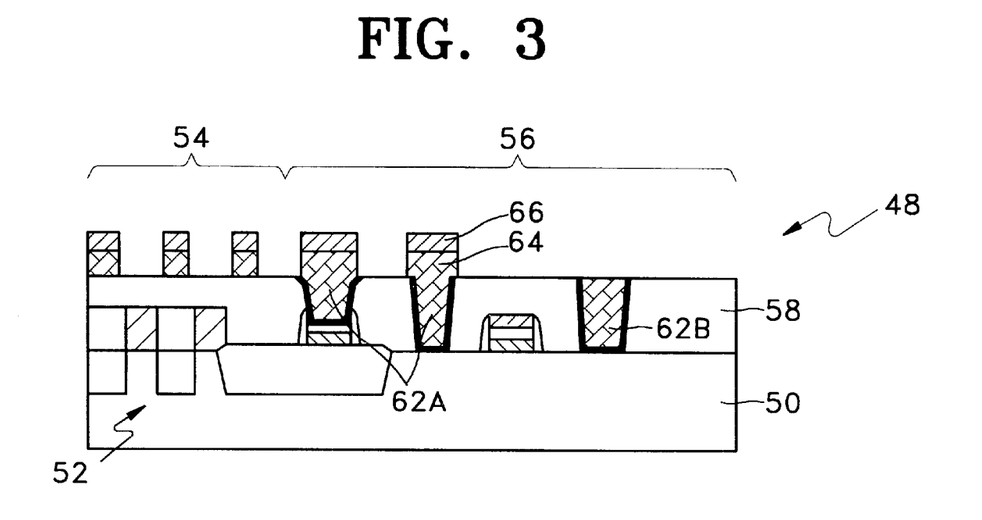
FIG. 3 is a cutaway side view of formation of bit lines above the contacts formed in FIG. 2 for a memory device including cell and peripheral regions, in accordance with the present invention.

FIG. 3 is a cutaway side view of formation of bit lines 64 above the bit line stud contacts 62 formed in FIG. 2. During this step, bit lines 64 are formed over studs 62A. The bit lines 64 in the peripheral regions serve as a landing pad for studs of subsequent layers. Stud 62B is not provided with a bit line, but will still serve as an interconnect for an upper layer. Following deposition of the bit line 64 material, a photoresist layer (not shown) is layered over the bit line material and patterned to define a bit line pattern, while exposing the top surface of stud 62B. In this manner, the bit line patterns, including bit line landing pads 64, and studs 62B are simultaneously formed.

Assuming an underlying tungsten plug, the bit line stud 62A may be formed by first providing a titanium Ti layer, for example by chemical vapor deposition (CVD) to a thickness of 100 Angstroms. This is followed by providing a layer of TiN, for example by chemical vapor deposition or atomic layer deposition (ALD) to a thickness of 300 Angstroms; followed by a layer of tungsten (W) of approximately 2000 Angstroms in thickness. The resulting structure is polished by chemical-mechanical polishing.

Assuming an underlying titanium nitride TiN plug, the bit line stud 62A may be formed by first providing a titanium Ti layer, for example by chemical vapor deposition (CVD) to a thickness of 100 Angstroms. This is followed by providing a layer of TiN, for example by chemical vapor deposition or atomic layer deposition (ALD) to a thickness of 1500 Angstroms; followed by a chemical-mechanical polishing process.

Formation of the bit line pattern 64 above the bit line studs 62A may be provided by first depositing a tungsten W by physical-vapor deposition (PVD) to a thickness of 800 Angstroms; followed by a silicon nitride capping layer 66 provided at a thickness of 1500–2500 Angstroms.

Figure 4:
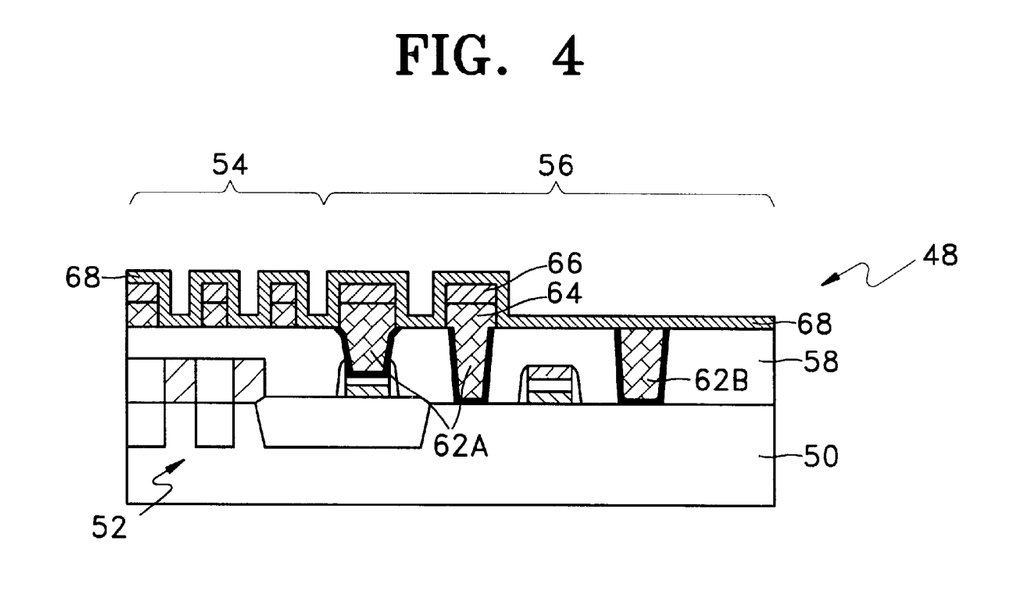
FIG. 4 is a cutaway side view of application of an etch-stop layer above the bit lines formed in FIG. 3 for a memory device including cell and peripheral regions, in accordance with the present invention.

FIG. 4 is a cutaway side view of application of an etch-stop layer 68 above the bit lines 64 and plugs 62B formed in FIG. 3. The etch-stop layer 68, for example comprising silicon nitride $Si_3N_4$ is deposited to a thickness of approximately 200–700 Angstroms, preferably 400 Angstroms.

Figure 5:
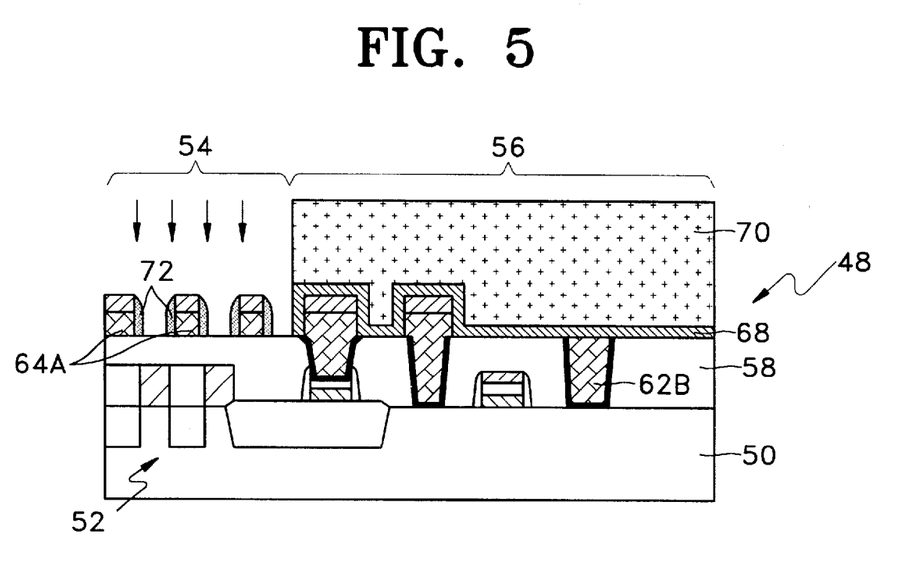
FIG. 5 is a cutaway side view of application of a photoresist layer above the etch stop layer formed in FIG. 4, for masking the etch-stop layer in the peripheral region, for a memory device including cell and peripheral regions, in accordance with the present invention.

FIG. 5 is a cutaway side view of application of a photoresist mask 70 above the etch stop layer formed in FIG. 4, for selectively masking the etch-stop layer 68 in the peripheral region 56, to allow for removal of the etch-stop layer 68 in the cell region 54. The removal of the etch-stop layer in the cell region forms lateral spacers 72 on the sides of the cell region bit lines 64A, as in the conventional embodiments.

Figure 6:
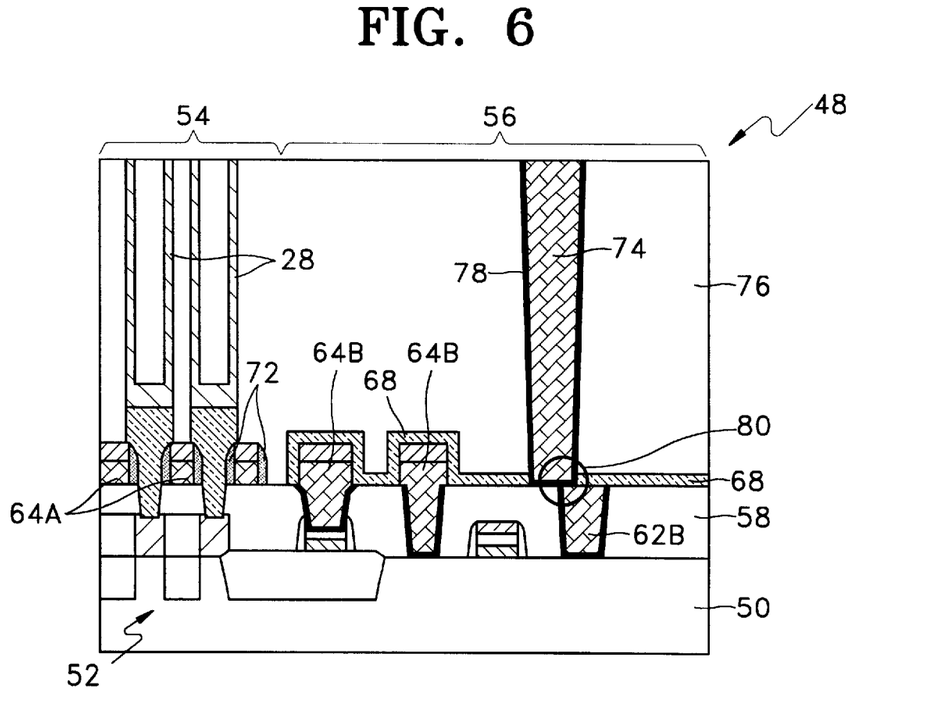
FIG. 6 is a cutaway side view of formation of an upper-layer stud formed above the bit line, using the peripheral region etch-stop layer as an alignment mechanism for aligning the upper and lower studs, for a memory device including cell and peripheral regions, in accordance with the present invention.

FIG. 6 is a cutaway side view of formation of an upper-layer stud 74 above the lower-level stud 62B. A second inter-level dielectric layer 76 is formed above the resulting structure, including a silicon-nitride etch-stop layer 68 on the bit lines 64B and underlying bit line studs 62B in the peripheral regions 56, and the cell structure 52 having a removed silicon-nitride layer in the cell regions 54. Capacitor structures 28 are formed in a conventional manner in the cell region 54. A stud hole 78 is etched in the second inter-level dielectric layer 76, using the underlying etch-stop layer as a vertical guide for ensuring that the hole properly exposes the top of the underlying stud 62B, without over-etching the underlying first inter-layer dielectric 58 at the sides of the underlying stud 62B in the stud coupling region 80.

To ensure proper vertical alignment and coupling of the lower and upper studs 62B, 74 respectively, the etch-stop layer 68 material is chosen so as to have a different etch selectivity as compared to that of the underlying first inter-layer dielectric insulating layer 58. In this manner, when forming upper stud hole 78, a first etch process can be used to accurately etch the second insulating dielectric layer 76 to the upper surface of the etch-stop layer 68. Following this, the etch-stop material layer 76 is accurately etched in a second etch process to the upper surface of the underlying stud 62B, and the top surface of the first insulating layer 58.

In a preferred embodiment, the second insulating dielectric layer 76 etching is performed until the top surface of the etch-stop layer 68 is exposed by the first etch process comprising 1500 W, 40 mTorr, $C_4F_6+O_2+Ar$, 280", and then the etch-stop layer attractive etching is performed, using the underlying inter-layer dielectric layer 58 as an etch stopper to the etch stop layer, enough to just expose the top surface of the studs by the second etch process comprising 600 W, 50 mTorr, $CHF_3+Ar+H_2$, 105". As a result, the upper stud holes 74 on the lower studs 62B are provided.

Similar procedures are applicable, simultaneously, or separately with the above process, for providing inter-layer studs (not shown in the drawings) for coupling to other bit-lines of the peripheral region, for example bit lines 64B including bit-line landing pads.

Figure 7:
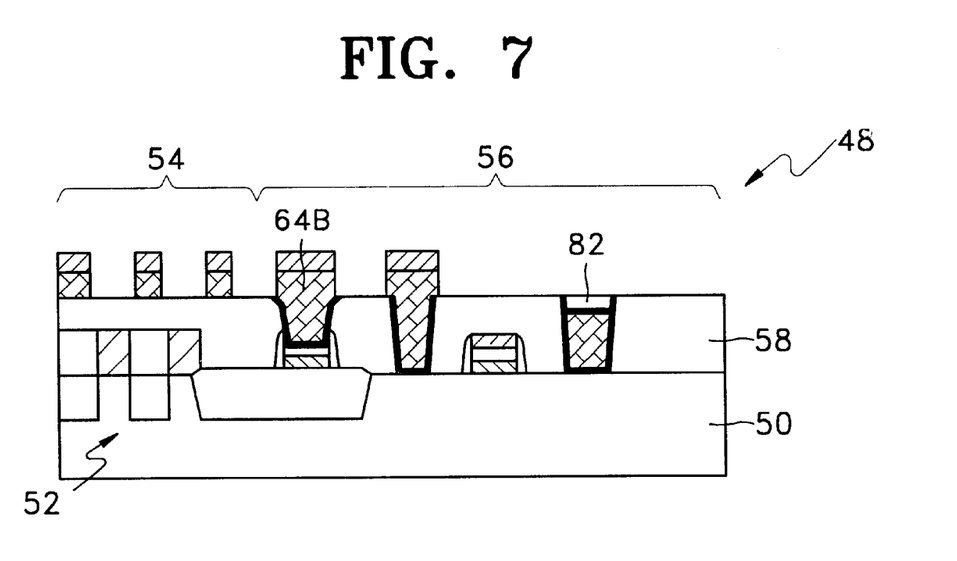
FIG. 7 is a cutaway side view of a memory device including cell and peripheral regions, illustrating the recess of stud material that occurs during bit line etching.
Figure 8:
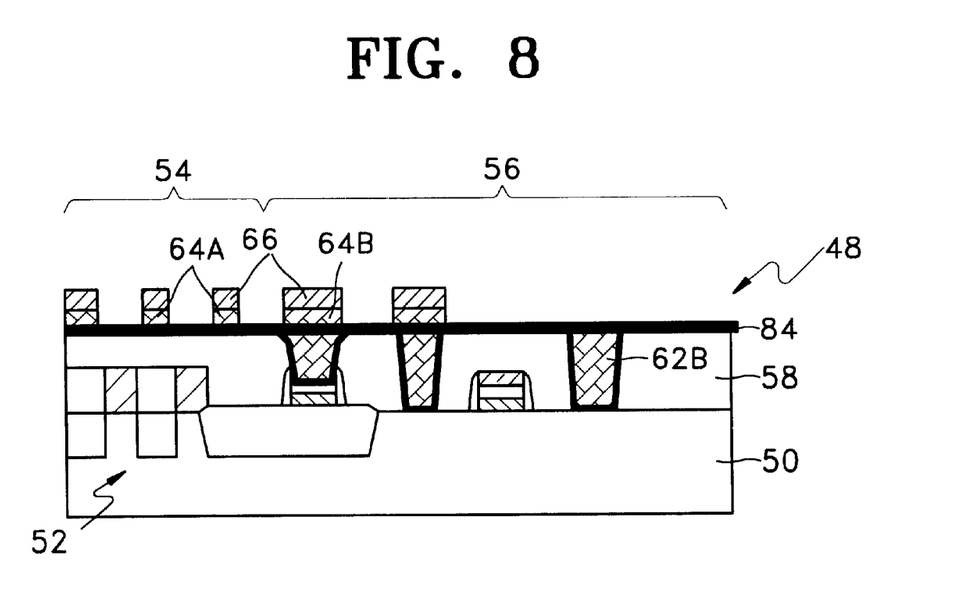
FIG. 8 is a cutaway side view of a memory device including cell and peripheral regions, illustrating the use of an etch-blocking layer for eliminating the recess illustrated in FIG. 7, in accordance with the present invention.

FIG. 7 is a cutaway side view of a memory device including cell and peripheral regions, illustrating a recess 82 of stud material that occurs during bit line etching as a result of chemical-mechanical polishing. FIG. 8 is a cutaway side view of a memory device including cell and peripheral regions, illustrating the use of an etch-blocking layer 84 for eliminating the recess illustrated in FIG. 7, in accordance with the present invention. In this embodiment, an additional conductive etch-stop layer 84, for example TiN formed at a thickness of 100–300 Angstroms, can be introduced following the formation of the underlying studs 62 as in FIG. 2. Following this, the bit lines, and bit line capping layers are sequentially deposited. Using a photoresist mask, the bit line pattern and bit line landing pads arc provided, while removing the bit line material over the stud 62B without attacking the underlying tungsten, due to the etch-blocking layer 84. Following this, the etch-blocking layer is etched using the bit-line pattern 64A, 64B as a mask and the processes continue as described above in FIGS. 4–6.

In this manner, the present invention provides a inter-layer connectivity technique whereby an etch-stop material layer 68 is formed over a stud of an underlying layer. A stud of an overlying layer is formed through the etch-stop layer, using the etch-stop layer as a vertical alignment mechanism to ensure proper connectivity between the upper and lower studs. By providing an etch-stop layer with a different etching selectivity as compared to the underlying insulating layer, etching depth precision is ensured.

The present invention further provides a circuit and method by which the etch-stop layer remains in only the peripheral region of the device, thereby allowing for proper outgassing of elements during later processes, and proper subsequent alloying procedures to properly cure underlying contacts and transistors.

While this invention has been particularly shown and described with references to preferred embodiments thereof, it will be understood by those skilled in the art that various changes in form and details may be made herein without departing from the spirit and scope of the invention as defined by the appended claims.

For example, in an alternative embodiment, rather than a single metal deposition step, separate photolithographic processes may be employed to provide the metal contacts on the bit line patterns and the metal contact on the bit line stud.

We claim:

1. A semiconductor device comprising:
   a first insulating layer;
   a first stud formed in the first insulating layer;
   an etch stop material layer formed over the first stud;
   an etch-blocking layer above the first stud and below the etch-stop material layer;
   a second insulating layer formed over the etch stop material layer; and
   a second connectivity stud formed through the second insulating layer and through the etch stop material layer, the first and second studs being in electrical contact with each other.

2. The semiconductor device of claim 1 wherein the etch stop material layer and second insulating layer have different etching selectivities.

3. The semiconductor device of claim 2 wherein the second connectivity stud is formed by first etching the second insulating layer to the etch stop layer, followed by etching the etch stop material layer to expose the first stud.

4. The semiconductor device of claim 1 wherein the etch stop material layer comprises silicon nitride.

5. A semiconductor device comprising:
   first and second circuit regions laterally disposed in a first insulating layer, wherein the first circuit region comprises a conductive line, and wherein the second circuit region comprises a stud;
   an etch stop material layer formed over the conductive line and the stud, the etch stop layer being selectively patterned in the first circuit region to form lateral spacers on lateral faces of the conductive line, the etch stop material layer forming a coating on the second circuit region, the lateral spacers of the first region and the coating of the second region being formed from the same etch stop material layer deposition;
   a second insulating layer formed over the etch stop material layer;
   a contact hole provided through the second insulating layer, and through the etch stop material layer to expose an upper portion of the stud; and
   contact metal provided in the contact hole, electrically contacting the stud.

6. The semiconductor device of claim 5 wherein the first circuit region comprises a cell region and wherein the second circuit region comprises a peripheral region of a memory device.

7. The semiconductor device of claim 6 wherein the conductive line comprises a bit line of the memory device.

8. The semiconductor device of claim 5 wherein the etch stop material layer comprises silicon nitride.

9. The semiconductor device of claim 5 wherein the etch stop material layer and second insulating layer have different etching selectivities.

10. The semiconductor device of claim 9 wherein the contact hole is formed by first etching the second insulating layer to the etch stop material layer, followed by etching the etch stop material layer to expose the stud.

11. The semiconductor device of claim 5 wherein the etch stop material layer forms lateral spacers for the conductive lines in the first circuit region.

12. The semiconductor device of claim 5 further comprising an etch-blocking layer above the stud and below the etch-stop material layer.

13. A semiconductor device comprising:
   a circuit formed in a semiconductor substrate, said circuit having first and second terminals;
   a first insulating layer formed above the circuit;
   a stud hole formed in the first insulating layer above the first terminal;
   an electrically conductive stud formed in the stud hole, electrically contacting the first terminal;
   a conductive line formed on the first insulating layer above the second terminal, said conductive line electrically contacting the second terminal;
   an etch stop material layer formed over the first insulating layer, stud, and conductive line, said etch stop material providing insulative spacers on lateral portions of the conductive line, the etch stop material layer forming a coating on the stud, the lateral insulative spacers of the conductive line and the coating of the stud being formed from the same etch stop material layer deposition;
   a second insulating layer formed over the etch stop material layer;
   a contact hole formed through the second insulating layer, and through the etch stop material layer to an upper portion of the stud; and
   contact metal formed in the contact hole, electrically contacting the stud.

14. A semiconductor device comprising:
   first and second circuit regions laterally disposed in a first insulating layer, wherein the first circuit region comprises a conductive line, and wherein the second circuit region comprises a stud;
   an etch stop material layer formed over the conductive line and the stud, the etch stop layer being selectively patterned in the first circuit region to form lateral spacers on lateral faces of the conductive line, the etch stop material layer forming a coating on the second circuit region, the lateral spacers of the first region and the coating of the second region being formed from the same etch stop material layer deposition;
   a second insulating layer formed over the etch stop material layer;
   a contact hole provided through the second insulating layer, and through the etch stop material layer, to expose an upper portion of the stud; and
   contact metal provided in the contact hole, electrically contacting the stud, such that the etch stop material layer operates to form lateral insulative spacers of the conductive line and serves as an etch stop during forming of the contact hole.

15. A method of forming a semiconductor device, comprising:
   forming a first insulating layer above a semiconductor circuit;
   providing a first stud hole the first insulating layer, and depositing conductive material to form a first stud in the first stud hole;
   following depositing conductive material in the first stud hole, forming an etch-blocking layer above the first stud;
   providing an etch stop material layer over the first stud;
   forming a second insulating layer over the etch stop material layer;
   providing a second stud hole through the second insulating layer and through the etch stop material layer to expose a top portion the first stud; and
   providing conductive material to form a second stud in the second stud hole.

16. The method of claim 15 wherein providing an etch stop material layer comprises providing a silicon nitride etch stop material layer.

17. The method of claim 15 wherein the etch stop material layer and second insulating layer have different etching selectivities.

18. The method of claim 17 wherein the second stud hole is formed by first etching the second insulating layer to the etch stop material layer, followed by second etching the etch stop material layer to expose the first stud.

19. The method of claim 18 wherein the first etching is performed with an oxide etchant gas, and wherein the second etching is performed using a nitride etchant gas.

20. A method of forming a semiconductor device, comprising:

forming a first insulating layer above a semiconductor circuit;

forming a first circuit region comprising a conductive line on the first insulating layer, and forming a second circuit region comprising a stud through the first insulating layer;

providing an etch stop material layer over the first and second regions;

forming lateral spacers in the first circuit region on lateral faces of the conductive line by selectively removing the etch stop material layer in the first circuit region while leaving the etch stop material layer substantially intact in the second circuit region so as to form a coating on the second circuit region, the lateral spacers of the first region and the coating of the second region being formed from the same etch stop material layer deposition;

forming a second insulating layer over the first and second circuit regions;

providing a contact hole through the second insulating layer, and through the etch stop material layer to expose an upper portion of the stud; and providing contact metal in the contact hole, electrically contacting the stud.

21. A method of forming a semiconductor device, comprising:

forming a circuit having first and second terminals in a semiconductor substrate;

forming a first insulating layer above the circuit;

etching a stud hole above the first terminal, and forming an electrically conductive contact metal in the stud hole, electrically contacting the first terminal;

forming a conductive line on the insulating layer above the second terminal, said conductive line electrically contacting the second terminal;

providing an etch stop material layer over the first insulating layer, stud, and conductive line;

selectively removing said etch stop material layer to provide insulative spacers on lateral portions of the conductive line, and to substantially retain the etch stop material layer in a region above the stud so as to form a coating on the stud, the lateral insulative spacers of the conductive line and the coating on the stud being formed from the same etch stop material layer deposition;

forming a second insulating layer over the etch stop material layer;

providing a contact hole through the second insulating layer, and through the etch stop layer to an upper portion of the stud; and providing electrically conductive contact metal in the contact hole.

* * * * *